United States Patent
Liu et al.

(10) Patent No.: US 11,680,203 B2
(45) Date of Patent: Jun. 20, 2023

(54) RED PHOSPHOR, PREPARATION METHOD THEREOF AND LIGHT-EMITTING DEVICE PREPARED THEREFROM

(71) Applicant: GRIREM ADVANCED MATERIALS CO., LTD., Beijing (CN)

(72) Inventors: Ronghui Liu, Beijing (CN); Guantong Chen, Beijing (CN); Yuanhong Liu, Beijing (CN); Xiaole Ma, Beijing (CN)

(73) Assignee: GRIREM ADVANCED MATERIALS CO., LTD., Beijing (CN)

( * ) Notice: Subject to any disclaimer, the term of this patent is extended or adjusted under 35 U.S.C. 154(b) by 418 days.

(21) Appl. No.: 16/612,299

(22) PCT Filed: Oct. 18, 2017

(86) PCT No.: PCT/CN2017/106750
§ 371 (c)(1),
(2) Date: Nov. 8, 2019

(87) PCT Pub. No.: WO2018/209888
PCT Pub. Date: Nov. 22, 2018

(65) Prior Publication Data
US 2021/0155848 A1    May 27, 2021

(30) Foreign Application Priority Data

May 15, 2017 (CN) .......................... 201710339569.4

(51) Int. Cl.
*C09K 11/08* (2006.01)
*C09K 11/66* (2006.01)
*C09K 11/61* (2006.01)
*C09K 11/02* (2006.01)
*H01L 33/50* (2010.01)
*C09K 11/67* (2006.01)

(52) U.S. Cl.
CPC .......... *C09K 11/677* (2013.01); *C09K 11/025* (2013.01); *H01L 33/502* (2013.01)

(58) Field of Classification Search
CPC ... C09K 11/0838; C09K 11/02; C09K 11/664; C09K 11/616; C09K 11/617; C09K 11/675; C09K 11/628; C09K 11/645; C09K 11/665; C09K 2211/181; C09K 2211/188; H01L 33/502; H01L 33/504; H01L 33/507; H05B 33/14; Y02B 20/181; Y10T 428/2991
USPC ...... 252/301.4 F, 301.4 H, 301.4 R, 301.6 F; 313/486, 503; 362/97.1, 84; 428/403
See application file for complete search history.

(56) References Cited

U.S. PATENT DOCUMENTS

2016/0024378 A1 * 1/2016 Murphy ............... C09K 11/617
362/84
2016/0160122 A1 * 6/2016 You ..................... C09K 11/025
428/403

FOREIGN PATENT DOCUMENTS

| CN | 103003388 A | 3/2013 |
| CN | 106479485 A | 3/2017 |
| CN | 107057702 A | 8/2017 |

OTHER PUBLICATIONS

International Search Report of PCT/CN2017/106750.
Written Opinion of PCT/CN2017/106750.

* cited by examiner

*Primary Examiner* — Matthew E. Hoban
*Assistant Examiner* — Lynne Edmondson

(57) ABSTRACT

The present invention relates to a red phosphor, a preparation method thereof and a light-emitting device prepared therefrom. A particle of the red phosphor consists of a phosphor inner core having a chemical formula of $A_{x1}Ge_{z1}F_6:y_1Mn^{4+}$ and an outer shell having a chemical formula of $B_{x2}M_{z2}F_6:y_2Mn^{4+}$, wherein $1.596 \leq x_1 \leq 2.2$, $1.6 \leq x_2 \leq 2.2$, $0.001 \leq y_1 \leq 0.2$, $0 \leq y_2 \leq 0.2$, $0.9 \leq z_1 \leq 1.1$, and $0.9 \leq z_2 \leq 1.1$; A and B are independently selected from alkali metal elements; and M is Si, or Si and Ge. The red phosphor provided by the present invention has high luminous efficiency and stability. Moreover, the phosphor alone or in combination with other luminescent materials can be used for preparing a light-emitting device with high performance.

20 Claims, No Drawings

RED PHOSPHOR, PREPARATION METHOD THEREOF AND LIGHT-EMITTING DEVICE PREPARED THEREFROM

CROSS-REFERENCE TO RELATED APPLICATIONS

This application is a national stage application of PCT Application No. PCT/CN2017/106750. This application claims priority from PCT Application No. PCT/CN2017/106750 filed Oct. 18, 2017 and CN 201710339569.4 filed May 15, 2017, the contents of which are incorporated herein in the entirety by reference.

Some references, which may include patents, patent applications, and various publications, are cited and discussed in the description of the present disclosure. The citation and/or discussion of such references is provided merely to clarify the description of the present disclosure and is not an admission that any such reference is "prior art" to the present disclosure described herein. All references cited and discussed in this specification are incorporated herein by reference in their entireties and to the same extent as if each reference was individually incorporated by reference.

TECHNICAL FIELD

The present invention belongs to the field of luminescent materials, and particularly relates to a red phosphor, a preparation method thereof and a light-emitting device prepared therefrom.

BACKGROUND

In recent years, panel displays have been blooming. Liquid crystal displays (LCD) have the most robust development momentum and have been widely used in the fields of mobile phones, laptops and high-definition televisions. Since liquid crystals do not emit light of their own, a backlight is an indispensable key component of a liquid crystal device.

For a liquid crystal display LED backlight, it is necessary for white light generated by "a blue-light LED chip+ phosphor" to produce pure red, blue and green light after filtering and splitting. Therefore, phosphor is a key factor in determining a color gamut of an LED backlight liquid crystal display. Currently, a wide-color-gamut liquid crystal display LED backlight generally uses a combined solution of SiAlON:Eu green phosphor and fluoride red phosphor. A conventional silicon fluoride phosphor (for example, $KSiF_6$:$Mn^{4+}$) has relatively better water resistance but poor luminous efficiency and temperature tolerance, and a germanium fluoride phosphor ($KGeF_6$:$Mn^{4+}$) has excellent luminous efficiency and temperature tolerance but poor water resistance, which seriously restrict the development of the wide-color-gamut display technology.

Thus, it is urgent to develop a novel high-performance red phosphor to meet the application needs of the wide-color-gamut liquid crystal display LED backlight.

SUMMARY

For this purpose, the present invention provides a red phosphor, which has such favorable comprehensive properties as luminous efficiency, temperature tolerance and water resistance.

To achieve the above objective, the present invention adopts the following technical means.

There is provided a red phosphor. A particle of the red phosphor consists of a phosphor inner core having a chemical formula of $A_{x1}Ge_{z1}F_6$:$y_1Mn^{4+}$ and an outer shell having a chemical formula of $B_{x2}M_{z2}F_6$:$y_2Mn^{4+}$, wherein $1.596 \leq x_1 \leq 2.2$, $1.6 \leq x_2 \leq 2.2$, $0.001 \leq y_1 \leq 0.2$, $0 \leq y_2 \leq 0.2$, $0.9 \leq z_1 \leq 1.1$, and $0.9 \leq z_2 \leq 1.1$; A and B are independently selected from alkali metal elements; and M is Si, or Si and Ge.

The red phosphor adopting the above composition and ratios has not only favorable luminous efficiency but also excellent properties, including such stability as temperature tolerance and water resistance.

Preferably, A and B are independently selected from Li, Na and K, and are preferably K.

In order to further enhance the temperature tolerance and the water resistance of the red phosphor provided by the present invention, preferably, a molar ratio m of Si to M in the outer shell meets the following condition: $0.5 \leq m \leq 1$.

In order to further enhance the temperature tolerance and the water resistance of the red phosphor provided by the present invention, preferably, a molar ratio n of Mn to M in the outer shell meets the following condition: $0 \leq n \leq 0.1$, preferably, $0 \leq n \leq 0.05$.

Preferably, $0.5 \leq m \leq 1$, and $0 \leq n \leq 0.05$.

Preferably, m is 1, and n is 0. That is, M in the outer shell includes only Si and no Mn.

Preferably, the outer shell has a thickness of 0.5 μm to 15 μm, preferably, 1 μm to 12 μm, further preferably, 2 μm to 5 μm.

Preferably, the particle size of the red phosphor is 5 μm to 45 μm, preferably, 10 μm to 40 μm, further preferably, 15 μm to 35 μm.

Preferably, the outer shell has a thickness of 2 μm to 5 μm, and the particle size of the red phosphor is 15 μm to 35 μm. Owing to the above settings of the thickness of the outer shell and the particle size of the red phosphor, the red phosphor achieves the best comprehensive properties.

The phosphor has the chemical formula of $K_{x1}Ge_{z1}F_6$:$y_1Mn^{4+}$@$K_{x2}M_{z2}F_6$:$y_2Mn^{4+}$. When the molar ratios of K, M, F and Mn and the total molar ratio of compounds are within certain ranges, the prepared phosphor has excellent luminous efficiency. M may be replaced with, but not limited to, Ti.

The present invention further provides a preparation method of the red phosphor provided by the present invention. The preparation method includes the following steps:

(1) performing dosing based on $A_{x1}Ge_{z1}F_6$:$y_1Mn^{4+}$, separately dissolving compounds that contain A, Ge and Mn in a 30-50 wt % hydrofluoric acid solution at 10° C. to 50° C., performing mixing, and sieving, washing and drying an obtained precipitate to obtain powder of an $A_{x1}Ge_{z1}F_6$:$y_1Mn^{4+}$ phosphor inner core;

(2) performing dosing based on $B_{x2}M_{z2}F_6$:$y_2Mn^{4+}$ in which M is Si and Ge or Si, separately dissolving compounds that contain A and M, or compounds that contain A, M and Mn in a 30-50 wt % hydrofluoric acid solution at 10° C. to 50° C., and performing mixing to obtain a mother liquid material; and (3) adding the powder of the phosphor inner shell obtained in step (1) into the mother liquid material obtained in step (2), performing stirring to obtain a precipitate, and sieving, washing and drying the obtained precipitate to obtain the red fluorescent powder.

Preferably, stirring is performed for preferably 2 minutes to 60 minutes after mixing.

Preferably, the stirring in step (3) is performed for 2 minutes to 60 minutes.

The present invention further provides a light-emitting device including the red phosphor provided by the present invention.

Preferably, the light-emitting device further includes a radiation source, preferably, a semiconductor light-emitting chip.

Preferably, the semiconductor light-emitting chip is an LED chip with an emission peak wavelength of 440 nm to 470 nm.

In addition, the phosphor provided by the present invention or such light conversion film materials as resin, silica gel, plastics, glass and ceramics doped with the phosphor provided by the present invention may be combined with an ultraviolet, purple-light or blue-light radiation source to form light-emitting devices that can be extensively applied in the lighting or displaying field.

Compared with the prior art, the present invention has the following advantages and beneficial effects:

(1) The phosphor provided by the present invention is a novel red phosphor for a white-light LED. The inner core is a germanium fluoride phosphor with favorable luminous efficiency and temperature tolerance. The outer shell is made from a silicon-containing fluoride material with excellent water resistance. Thus, the phosphor has such favorable comprehensive properties as luminous efficiency, temperature tolerance and water resistance.

(2) The phosphor provided by the present invention may be combined with other phosphors to manufacture the light-emitting device having the characteristics of high luminous efficiency, high weather fastness and wide-color-gamut display.

DETAILED DESCRIPTION

To facilitate understanding of the present invention, the following embodiments of the present invention are listed. It should be understood by those skilled in the art that these embodiments are only intended to help understand the present invention and by no means are to be construed as any specific limitation on the present invention.

It should be noted that in case of no conflict, the embodiments and features in the embodiments of the present application can be combined with each other. The present invention will be illustrated in detail below with reference to the embodiments.

It should be noted that the terms used herein are for the purpose of describing specific implementation modes, and are not intended to limit exemplary implementation modes of the present application. As used herein, unless otherwise explicitly pointed out by the context, singular forms are intended to include plural forms. Moreover, it should be understood that when the term "comprising" and/or "including" is used in the description, it is intended to indicate the presence of features, steps, operations, apparatuses, devices, components, and/or combinations thereof.

Comparative Example 1

(1) Dosing is performed based on $K_2Ge_{0.9}F_6:0.1Mn^{4+}$. Compounds that contain K, Ge and Mn are separately dissolved in a 30-50 wt % hydrofluoric acid solution at 10° C. to 50° C. Mixing is performed. An obtained precipitate is sieved, washed and dried to obtain a $K_2Ge_{0.9}F_6:0.1Mn^{4+}$ phosphor.

(2) The red phosphor obtained in the Comparative Example of the present invention and a $\beta$-SiAlON:$Eu^{2+}$ green phosphor are uniformly dispersed in organic silica gel at a mass ratio of 4:1. A blue-light LED (with an emission wavelength of 450 nm) is coated with a mixture obtained after mixing and defoaming. Drying is performed for 3 hours at 150° C., Then, encapsulation is accomplished to obtain a white-light LED device. 150 mA current is provided to the white-light LED device at the humidity of 85% and the temperature of 85° C. for lightening for 168 hours. Changes of luminous flux of the white-light LED device are tested and the luminous flux decay rate is calculated. The decay rate is obtained by dividing the difference between an initial luminous flux and a luminous flux after 168 hours by the initial luminous flux. The obtained results are listed in Table 1.

Embodiments 1 to 21

(1) Dosing is performed based on $K_{x1}Ge_{z1}F_6:y_1Mn^{4+}$. Compounds that contain K, Ge and Mn are separately dissolved in a 30-50 wt % hydrofluoric acid solution at 10° C. to 50° C. Mixing is performed. An obtained precipitate is sieved, washed and dried to obtain powder of a $K_{x1}Ge_{z1}F_6:y_1Mn^{4+}$ phosphor inner core.

(2) Dosing is performed based on $K_{x2}M_{z2}F_6:y_2Mn^{4+}$, wherein M is Si and Ge, or Si. Compounds that contain A and M, or compounds that contain A, M and Mn are separately dissolved in a 30-50 wt % hydrofluoric acid solution at 10° C. to 50° C. Mixing is performed to obtain a mother liquid material.

(3) The powder of the phosphor inner core obtained in step (1) is added into the mother liquid material obtained in step (2). Stirring is performed to obtain a precipitate. The obtained precipitate is sieved, washed and dried to obtain the red phosphor. Specific compositions of products in Embodiments 1 to 21 are listed in Table 1.

(4) The red phosphor obtained in the Embodiments 1 to 21 of the present invention and a $\beta$-SiAlON:$Eu^{2+}$ green phosphor are uniformly dispersed in organic silica gel at a mass ratio of 4:1. A blue-light LED (with an emission wavelength of 450 nm) is coated with a mixture obtained after mixing and defoaming. Drying is performed for 3 hours at 150° C. Then, encapsulation is accomplished to obtain a white-light LED device. 150 mA current is provided to the white-light LED device at the humidity of 85% and the temperature of 85° C. for lightening for 168 hours. Changes of luminous flux of the white-light LED device are tested and the luminous flux decay rate is calculated. The decay rate is obtained by dividing the difference between an initial luminous flux and a luminous flux after 168 hours by the initial luminous flux. The obtained results are listed in Table 1.

TABLE 1

|  | Chemical Formula | Thickness of Outer Shell (μm) | Particle Size (μm) | Encapsulation Luminous Flux (%) | Luminous Flux Decay Rate at the humidity of 85% and the temperature of 85° C. (%) | Display Color Gamut (% NTSC) |
| --- | --- | --- | --- | --- | --- | --- |
| Comparative Example 1 | $K_2Ge_{0.9}F_6:0.1\ Mn^{4+}$ | 0 | 26 | 100 | 5 | 92 |

TABLE 1-continued

| | Chemical Formula | Thickness of Outer Shell (μm) | Particle Size (μm) | Encapsulation Luminous Flux (%) | Luminous Flux Decay Rate at the humidity of 85% and the temperature of 85° C. (%) | Display Color Gamut (% NTSC) |
|---|---|---|---|---|---|---|
| Embodiment 1 | $K_2Ge_{0.9}F_6:0.1\ Mn^{4+}@K_2Si_{0.6}Ge_{0.25}F_6:0.05\ Mn^{4+}$ | 2 | 15 | 108 | 2 | 93 |
| Embodiment 2 | $K_2Ge_{0.92}F_6:0.08\ Mn^{4+}@K_{1.6}Si_{0.6}Ge_{0.48}F_6:0.02\ Mn^{4+}$ | 3 | 35 | 105 | 2.6 | 94 |
| Embodiment 3 | $K_2Ge_{0.89}F_6:0.11\ Mn^{4+}@K_{1.6}Si_{0.6}Ge_{0.48}F_6:0.02\ Mn^{4+}$ | 2.5 | 16 | 109 | 2.1 | 95 |
| Embodiment 4 | $K_2Ge_{0.82}F_6:0.18\ Mn^{4+}@K_{1.6}Si_{0.6}Ge_{0.48}F_6:0.02\ Mn^{4+}$ | 4.5 | 22 | 104 | 3.2 | 93 |
| Embodiment 5 | $K_{1.596}Ge_{1.1}F_6:0.001\ Mn^{4+}@K_2Si_{0.48}Ge_{0.48}F_6:0.04\ Mn^{4+}$ | 9 | 30 | 103 | 1.4 | 93 |
| Embodiment 6 | $K_{1.8}Ge_{0.99}F_6:0.06\ Mn^{4+}@K_{1.8}Si_{0.9}Ge_{0.12}F_6:0.03\ Mn^{4+}$ | 5 | 28 | 105 | 1 | 93 |
| Embodiment 7 | $K_{1.9}Ge_{0.905}F_6:0.12\ Mn^{4+}@K_{2.2}Si_{0.68}Ge_{0.25}F_6:0.02\ Mn^{4+}$ | 4 | 20 | 104 | 3 | 94 |
| Embodiment 8 | $K_2Ge_{0.8}F_6:0.2\ Mn^{4+}@K_2SiF_6$ | 3 | 10 | 101 | 0.5 | 94 |
| Embodiment 9 | $K_2Ge_{0.82}F_6:0.18\ Mn^{4+}@K_2Si_{0.95}F_6:0.05\ Mn^{4+}$ | 3.5 | 16 | 109 | 1.1 | 95 |
| Embodiment 10 | $K_2Ge_{0.82}F_6:0.18\ Mn^{4+}@K_2Si_{0.98}F_6:0.02\ Mn^{4+}$ | 1.5 | 13 | 105 | 1.6 | 93 |
| Embodiment 11 | $K_{2.2}Ge_{0.85}F_6:0.1\ Mn^{4+}@K_2Si_{0.6}Ge_{0.25}F_6:0.1\ Mn^{4+}$ | 0.5 | 12 | 101 | 4.3 | 94 |
| Embodiment 12 | $K_{2.1}Ge_{0.895}F_6:0.08\ Mn^{4+}@K_2Si_{0.45}Ge_{0.45}F_6:0.1\ Mn^{4+}$ | 4.5 | 40 | 103 | 1.2 | 92 |
| Embodiment 13 | $K_{2.1}Ge_{0.895}F_6:0.08\ Mn^{4+}@K_2Si_{0.47}Ge_{0.45}F_6:0.08\ Mn^{4+}$ | 6 | 34 | 108 | 1.3 | 93 |
| Embodiment 14 | $K_{2.1}Ge_{0.895}F_6:0.08\ Mn^{4+}@K_2Si_{0.5}Ge_{0.45}F_6:0.05\ Mn^{4+}$ | 4 | 25 | 102 | 2.6 | 92 |
| Embodiment 15 | $K_2Ge_{0.85}F_6:0.15\ Mn^{4+}@K_2Si_{0.6}Ge_{0.15}F_6:0.15\ Mn^{4+}$ | 1 | 5 | 107 | 4.1 | 92 |
| Embodiment 16 | $K_2Ge_{0.94}F_6:0.06\ Mn^{4+}@K_{1.6}Si_{0.9}Ge_{0.1}F_6:0.1\ Mn^{4+}$ | 11 | 33 | 109 | 0.5 | 94 |
| Embodiment 17 | $K_2Ge_{0.8}F_6:0.2\ Mn^{4+}@K_{1.996}Si_{0.7}Ge_{0.241}F_6:0.06\ Mn^{4+}$ | 9 | 36 | 105 | 1.8 | 95 |
| Embodiment 18 | $K_2Ge_{0.8}F_6:0.2\ Mn^{4+}@K_{1.996}Si_{0.7}Ge_{0.3}F_6:0.001\ Mn^{4+}$ | 15 | 26 | 104 | 0.8 | 93 |
| Embodiment 19 | $K_2Ge_{0.8}F_6:0.2\ Mn^{4+}@K_2Si_{0.6}Ge_{0.4}F_6$ | 12 | 45 | 103 | 0.6 | 93 |
| Embodiment 20 | $K_2Ge_{0.8}F_6:0.2\ Mn^{4+}@K_2Si_{0.7}Ge_{0.3}F_6$ | 10 | 24 | 103 | 2.5 | 92 |
| Embodiment 21 | $K_2Ge_{0.8}F_6:0.2\ Mn^{4+}@K_2Si_{0.5}Ge_{0.5}F_6$ | 6 | 21 | 101 | 3.1 | 91 |

Note:
Taking the luminous flux in the Comparative Example as the reference value 100, the luminous flux in the Embodiments is obtained by dividing their actual luminous flux by the actual luminous flux in the Comparative Example, and then multiplying by 100.

It is apparent that the above-described embodiments are merely illustrative of the examples, and are not intended to limit the implementation modes. Other variations or modifications in different forms may be made by those of ordinary in the art based on the above description. There is no need and no way to exhaust all of the implementation modes. Obvious changes or variations resulting therefrom are still within the scope of protection of the present invention.

The foregoing description of the exemplary embodiments of the present invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A red phosphor, wherein a particle of the red phosphor consists of a phosphor inner core having a chemical formula of $A_{x1}Ge_{z1}F_6:y_1Mn^{4+}$ and an outer shell having a chemical formula of $B_{x2}M_{z2}F_6:y_2Mn^{4+}$, wherein $1.596 \leq x_1 \leq 2.2$, $1.6 \leq x_2 \leq 2.2$, $0.1 < y_1 \leq 0.2$, $0 < y_{2 \leq 0.2}$, $_{0.9} \leq z_1 \leq 1.1$, $0.9 \leq z_{2 \leq 1.1}$; A and B are independently selected from alkali metal elements; and M is Si and Ge, and a molar ratio m of Si to M in the outer shell meets the following condition:

$0.5 \leq m < 1$;

the outer shell has a thickness of 0.5 μm to 15 μm.

2. The red phosphor according to claim 1, wherein A and B are independently selected from Li, Na and K.

3. The red phosphor according to claim 1, wherein a molar ratio n of Mn to M in the outer shell meets the following condition: $0<n\leq 0.1$.

4. The red phosphor according to claim 3, wherein $0.5\leq m<1$, and $0<n\leq 0.05$.

5. The red phosphor according to claim 1, wherein the particle size of the red phosphor is 5 μm to 45 μm.

6. The red phosphor according to claim 1, wherein the outer shell has a thickness of 2 μm to 5 μm, and the particle size of the red phosphor is 15 μm to 35 μm.

7. A preparation method of the red phosphor of claim 1, comprising:
 (1) performing dosing based on $A_{x1}Ge_{z1}F_6:y_1Mn^{4+}$, separately dissolving compounds that contain A, Ge and Mn in a 30-50 wt % hydrofluoric acid solution at 10° C. to 50° C., performing mixing, and sieving, washing and drying an obtained precipitate to obtain powder of an $A_{x1}Ge_{z1}F_6:y_1Mn^{4+}$ phosphor inner core;
 (2) performing dosing based on $B_{x2}M_{z2}F_6:y_2Mn^{4+}$ wherein M is Si and Ge, separately dissolving compounds that contain A and M, or compounds that contain A, M and Mn in a 30-50 wt % hydrofluoric acid solution at 10° C. to 50° C., and performing mixing to obtain a mother liquid material; and
 (3) adding the powder of the phosphor inner core obtained in step (1) into the mother liquid material obtained in step (2), performing stirring to obtain a precipitate, and sieving, washing and drying the obtained precipitate to obtain the red phosphor.

8. The preparation method according to claim 7, wherein the stirring in step (3) is performed for 2 minutes to 60 minutes.

9. A light-emitting device, comprising the red phosphor of claim 1.

10. The light-emitting device according to claim 9, further comprising a radiation source, and the radiation source is a semiconductor light-emitting chip, wherein the semiconductor light-emitting chip is an LED chip with an emission peak wavelength of 440 nm to 470 nm.

11. The red phosphor according to claim 2, wherein the particle size of the red phosphor is 5 μm to 45 μm.

12. The red phosphor according to claim 3, wherein the particle size of the red phosphor is 5 μm to 45 μm.

13. The red phosphor according to claim 4, wherein the particle size of the red phosphor is 5 μm to 45 μm.

14. The red phosphor according to claim 2, wherein the outer shell has a thickness of 2 μm to 5 μm, and the particle size of the red phosphor is 15 μm to 35 μm.

15. The red phosphor according to claim 3, wherein the outer shell has a thickness of 2 μm to 5 μm, and the particle size of the red phosphor is 15 μm to 35 μm.

16. The red phosphor according to claim 1, wherein A and B are K.

17. The red phosphor according to claim 1, wherein the outer shell has a thickness of 1 μm to 12 μm; and the particle size of the red phosphor is 10 μm to 40 μm.

18. The red phosphor according to claim 3, wherein the outer shell has a thickness of 1 μm to 12 μm; and the particle size of the red phosphor is 10 μm to 40 μm.

19. The red phosphor according to claim 2, wherein a molar ratio n of Mn to M in the outer shell meets the following condition: $0<n\leq 0.1$.

20. The red phosphor according to claim 16, wherein the particle size of the red phosphor is 5 μm to 45 μm.

* * * * *